(12) United States Patent
Zheng

(10) Patent No.: US 11,114,003 B2
(45) Date of Patent: Sep. 7, 2021

(54) FOLDABLE OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Yuan Zheng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/640,887

(22) PCT Filed: Jan. 13, 2020

(86) PCT No.: PCT/CN2020/071724
§ 371 (c)(1),
(2) Date: Feb. 21, 2020

(87) PCT Pub. No.: WO2021/031524
PCT Pub. Date: Feb. 25, 2021

(65) Prior Publication Data
US 2021/0142707 A1 May 13, 2021

(51) Int. Cl.
| | |
|---|---|
| *G06F 3/041* | (2006.01) |
| *G09G 3/00* | (2006.01) |
| *G09G 3/3225* | (2016.01) |
| *G09G 3/3266* | (2016.01) |
| *H01L 27/32* | (2006.01) |
| *H01L 51/00* | (2006.01) |

(52) U.S. Cl.
CPC .......... *G09G 3/035* (2020.08); *G06F 3/04164* (2019.05); *G09G 3/3225* (2013.01); *G09G 3/3266* (2013.01); *H01L 27/3276* (2013.01); *H01L 51/0097* (2013.01); *G09G 2300/0408* (2013.01); *G09G 2380/02* (2013.01); *H01L 2251/5338* (2013.01)

(58) Field of Classification Search
CPC .... G09G 3/035; G09G 3/3225; G09G 3/3266; G09G 2300/0408; G09G 2380/02; H01L 27/3276; H01L 51/0097; H01L 2251/5338; G06F 3/04164; G02F 1/133305
See application file for complete search history.

(56) References Cited

U.S. PATENT DOCUMENTS

2017/0031389 A1* 2/2017 Yoo .................... G06F 3/04164
2018/0224688 A1* 8/2018 Chen ................. G02F 1/133305

* cited by examiner

*Primary Examiner* — Abdul-Samad A Adediran
(74) *Attorney, Agent, or Firm* — Harness, Dickey & Pierce, P.L.C.

(57) ABSTRACT

A foldable organic light-emitting diode (OLED) display panel is provided. The foldable OLED display panel includes a display region having a folded region, and further including a plurality rows of pixel units, a plurality of signal lines, and gate on array (GOA) unit circuits of a plurality of stage, wherein the GOA unit circuits of each stage are electrically connected to the corresponding rows of the pixel units by the signal lines; the signal lines further include first sub-signal lines overlapping the folded region, and the first sub-signal lines are configured to be waveform lines, or surfaces of the first sub-signal lines are provided with through holes.

20 Claims, 5 Drawing Sheets

FOLDABLE OLED DISPLAY PANEL

FIELD DISCLOSURE

The present disclosure is related to the field of display driving technique, and in particular to a foldable organic light-emitting diode (OLED) display.

BACKGROUND OF DISCLOSURE

Unlike a thin-film transistor liquid crystal display (TFT-LCD) which needs a backlight, an active matrix organic light-emitting diode (AMOLED) panel has advantages, such as self-lumination, wide viewing angles, high color saturation, especially its low driving voltages, low power consumption, fast response times, light weight, thinness, simple structures, low costs, etc. Therefore, the AMOLED is regarded as one of the most promising products. A pixel driving of the AMOLED display driving technique belongs to a current type, which needs a gate on array (GOA) to supply a scanning signal. Currently, the foldable organic light-emitting diode (OLED) display panel becomes a research hotspot in the display industry due to its characteristics, such as playability, impact resistance and convenience of wear. However, during a folding process, the current foldable OLED display panel breaks easily and results in the failure of normal signal transmission due to the influence of bending stress on signal lines located in a folded region. Furthermore, the failure of normal signal transmission causes the display abnormality of the foldable OLED display panel.

In summary, during the folding process, the current foldable OLED display panel breaks easily and results in the failure of normal signal transmission due to the influence of bending stress on signal lines located in the folded region. Furthermore, the failure of normal signal transmission causes the display abnormality of the foldable OLED display panel.

Therefore, the prior art needs to be improved and increased.

SUMMARY OF INVENTION

Technical Problems

In a folding process, the current foldable organic light-emitting diode (OLED) display panel breaks easily and results in the failure of normal signal transmission due to the influence of bending stress on signal lines located in a folded region. Furthermore, the failure of normal signal transmission causes the display abnormality of the foldable OLED display panel.

Technical Solutions

In a first aspect, an embodiment of the present disclosure provides a foldable OLED display panel. The foldable OLED display panel includes a display region having a folded region and a non-folded region, and further including a plurality rows of pixel units, a plurality of signal lines, and gate on array (GOA) unit circuits of a plurality of stages, wherein the GOA unit circuits of each stage are electrically connected to the corresponding rows of the pixel units by the signal lines, and the GOA unit circuits of each stage are configured to drive the corresponding rows of the pixel units;

wherein the signal lines further include first sub-signal lines overlapping the folded region, and the first sub-signal lines are configured to be waveform lines, or surfaces of the first sub-signal lines are provided with through holes; wherein the signal lines further include second sub-signal lines overlapping the non-folded region, and the second sub-signal lines are straight lines.

In the foldable OLED display panel, the through holes on the surfaces of the first sub-signal lines are disposed in a single row, and the through holes are arranged along bending paths of the first sub-signal lines.

In the foldable OLED display panel, the through holes on the surfaces of the first sub-signal lines are disposed in a double row, and the through holes are arranged along bending paths of the first sub-signal lines.

In the foldable OLED display panel, shapes of the through holes are round or oval. In the foldable OLED display panel provided in the embodiments of the present disclosure, the signal lines include GOA signal lines, pixel unit signal lines and power signal lines.

In the foldable OLED display panel, an input signal in the GOA unit circuits of a Nth stage is provided by an output signal of the GOA unit circuits of a N−1th stage, and a switching signal of the pixel unit of a Nth row and an input signal of the GOA unit circuits of a N+1th stage are provided by an output signal of the GOA unit circuits of the Nth stage.

In the foldable OLED display panel, a buffer layer, an active layer, a first gate insulating layer, a first gate metal layer, a second gate insulating layer, a second gate metal layer, an interlayer insulating layer, a source-drain metal layer, a passivation layer and an anode metal layer are disposed from down to up on a flexible substrate of the folded region, wherein first through holes are disposed at two ends of an edge of the active layer, second through holes are disposed on the first gate metal layer, third through holes are disposed on the second gate metal layer, and fourth through holes are disposed on the source-drain metal layer.

In the foldable OLED display panel, the source-drain metal layer is electrically connected to the active layer via the first through holes, the source-drain metal layer is electrically connected to the first gate metal layer via the second through holes, the source-drain metal layer is electrically connected to the second gate metal layer via the third through holes, and the anode metal layer is electrically connected to the source-drain metal layer via the fourth through holes.

In the foldable OLED display panel, a material of each of the first sub-signal lines is the same as a material of each of the source-drain metal layer lines.

In a second aspect, an embodiment of the present disclosure provides a foldable OLED display panel. The foldable OLED display panel includes a display region having a folded region and a non-folded region, and further including a plurality rows of pixel units, a plurality of signal lines, and GOA unit circuits of a plurality of stages, wherein the GOA unit circuits of each stage are electrically connected to the corresponding rows of the pixel units by the signal lines, and the GOA unit circuits of each stage are configured to drive the corresponding rows of the pixel units;

wherein the signal lines further include first sub-signal lines overlapping the folded region, and the first sub-signal lines are configured to be waveform lines, or surfaces of the first sub-signal lines are provided with through holes;

In the foldable OLED display panel, the through holes on the surfaces of the first sub-signal lines are disposed in a single row, and the through holes are arranged along bending paths of the first sub-signal lines.

In the foldable OLED display panel, the through holes on the surfaces of the first sub-signal lines are disposed in a double row, and the through holes are arranged along bending paths of the first sub-signal lines.

In the foldable OLED display panel, shapes of the through holes are round or oval. In the foldable OLED display panel provided in the embodiments of the present disclosure, the signal lines include GOA signal lines, pixel unit signal lines and power signal lines.

In the foldable OLED display panel, an input signal in the GOA unit circuits of a Nth stage is provided by an output signal of the GOA unit circuits of a N−1th stage, and a switching signal of the pixel unit of a Nth row and an input signal of the GOA unit circuits of a N+1th stage are provided by an output signal of the GOA unit circuits of the Nth stage.

In the foldable OLED display panel, a buffer layer, an active layer, a first gate insulating layer, a first gate metal layer, a second gate insulating layer, a second gate metal layer, an interlayer insulating layer, a source-drain metal layer, a passivation layer and an anode metal layer are disposed from down to up on a flexible substrate of the folded region, wherein first through holes are disposed at two ends of an edge of the active layer, second through holes are disposed on the first gate metal layer, third through holes are disposed on the second gate metal layer, and fourth through holes are disposed on the source-drain metal layer.

In the foldable OLED display panel, the source-drain metal layer is electrically connected to the active layer via the first through holes, the source-drain metal layer is electrically connected to the first gate metal layer via the second through holes, the source-drain metal layer is electrically connected to the second gate metal layer via the third through holes, and the anode metal layer is electrically connected to the source-drain metal layer via the fourth through holes.

In the foldable OLED display panel, a material of each of the first sub-signal lines is the same as a material of each of the source-drain metal layer lines.

Beneficial Effects

Compared with the prior art, a part of the signal lines in the folded region are configured to be the waveform lines or provided with through holes in the foldable OLED display panel provided in the present disclosure, so that a bending resistance of the signal lines in the folded region is improved, and a risk of poor display caused by cracks in the signal lines after multiple bending is further reduced.

DETAILED DESCRIPTION OF EMBODIMENTS

The present disclosure provides a specific keyboard input system, a keyboard input method, and a storage medium. In order to clearly and specifically illustrate purposes, technical solutions and effects of the present disclosure, the present disclosure is further described in detail with reference to the drawings and embodiments. It should be understood that the specific embodiments described herein are only used to explain the present disclosure, and are not used to limit the present disclosure.

The present disclosure is directed to a technical problem that an existing foldable organic light-emitting diode (OLED) display panel breaks easily and leads to the failure of normal signal transmission during a folding process due to the influence of bending stress on the signal line located in a folded region. Furthermore, the failure of normal signal transmission causes the display abnormality of the foldable OLED display panel. The present embodiments may solve this defect.

Figure 1:
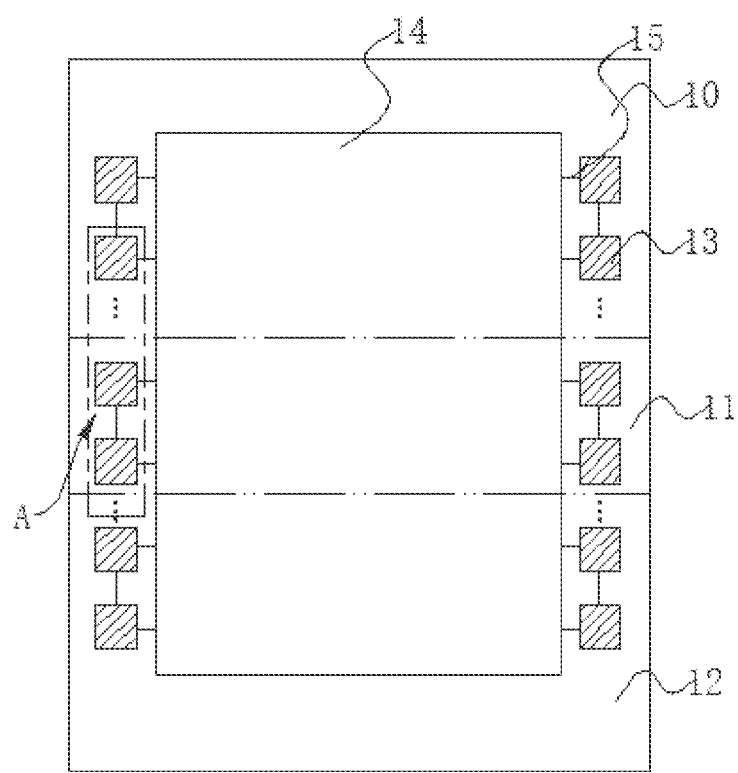
FIG. 1 is a schematic view of a structure of a foldable organic light-emitting diode (OLED) display panel of the present disclosure.

Refer to FIG. 1, which is a schematic view of a structure of the foldable OLED display panel of the present disclosure, wherein the foldable OLED display panel includes a display region 10 having a folded region 11 and a non-folded region 12, and further including a plurality rows of pixel units, a plurality of signal lines 15, and gate on array (GOA) unit circuits 13 of a plurality of stages, wherein the GOA unit circuits 13 of each stage are electrically connected to the corresponding rows of the pixel units by the signal lines 15, and the GOA unit circuits 13 of each stage are configured to drive the corresponding rows of the pixel units. The plurality rows of pixel units are in an effective display area 14 of the display region 10.

Figure 2:
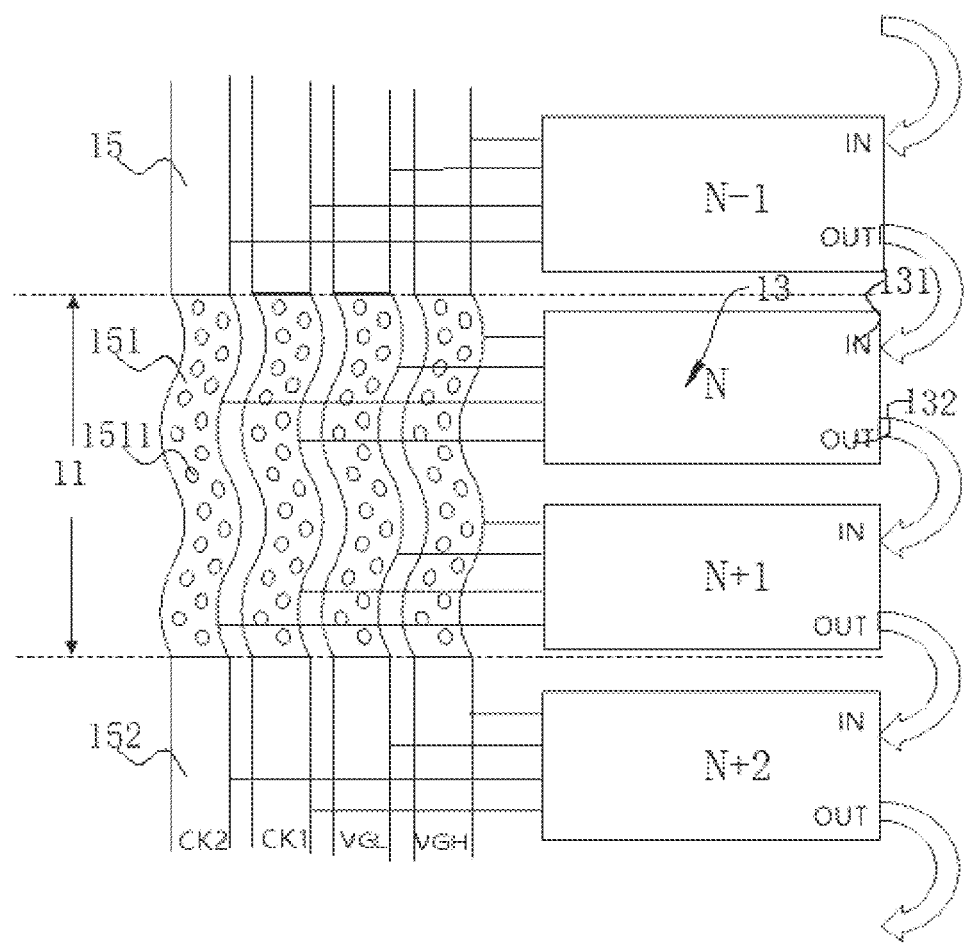
FIG. 2 is an enlarged schematic view of part A of the foldable OLED display panel according to an embodiment 1 of FIG. 1.

FIG. 2 is an enlarged schematic view of part A of the foldable OLED display panel according to an embodiment 1 of FIG. 1. The GOA unit circuits 13 of each stage are connected to the signal lines 15 by scanning data lines. The signal lines include GOA signal lines, pixel unit signal lines and power signal lines. The GOA signal lines include first clock signal lines (CK1), second clock signal lines (CK2), voltage gate high (VGH) signal lines and voltage gate low (VGL) signal lines for the GOA unit circuits 13 in regular work.

Specifically, an input signal (IN) 131 in the GOA unit circuits 13 of a Nth stage is provided by an output signal (OUT) of the GOA unit circuits of a N−1th stage, and a switching signal of the pixel unit of a Nth row and an input signal of the GOA unit circuits of a N+1th stage are provided by an output signal (OUT) 132 of the GOA unit circuits of the Nth stage.

Specifically, the signal lines 15 further include first sub-signal lines 151 overlapping the folded region 11, and the first sub-signal lines 151 are configured to be waveform lines, or surfaces of the first sub-signal lines 151 are provided with through holes 1511.

Preferably, the through holes 1511 on the surfaces of the first sub-signal lines 151 are disposed in a double row, and the through holes 1511 are arranged along bending paths of the first sub-signal lines 151.

Preferably, shapes of the through holes 1511 are round or oval.

Figure 3:
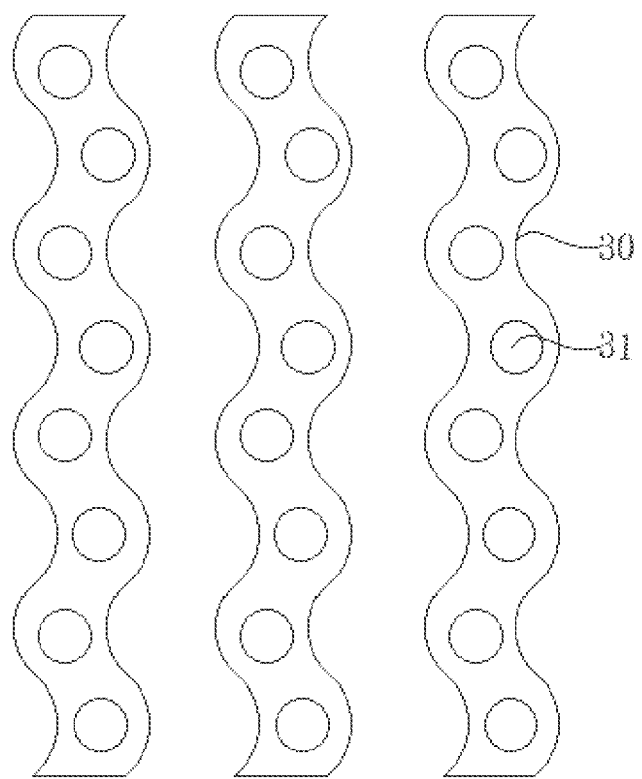
FIG. 3 is a schematic view of signal lines in a folded region of the foldable OLED display panel according to an embodiment 2 of the present disclosure.

FIG. 3 is a schematic view of signal lines in a folded region of the foldable OLED display panel according to an embodiment 2 of the present disclosure. The through holes 31 on the surfaces of the signal lines 30 in the folded region are disposed in a single row, and the through holes 31 are arranged along bending paths of the signal lines 30. Preferably, shapes of the through holes 31 are round or oval.

Figure 4A:
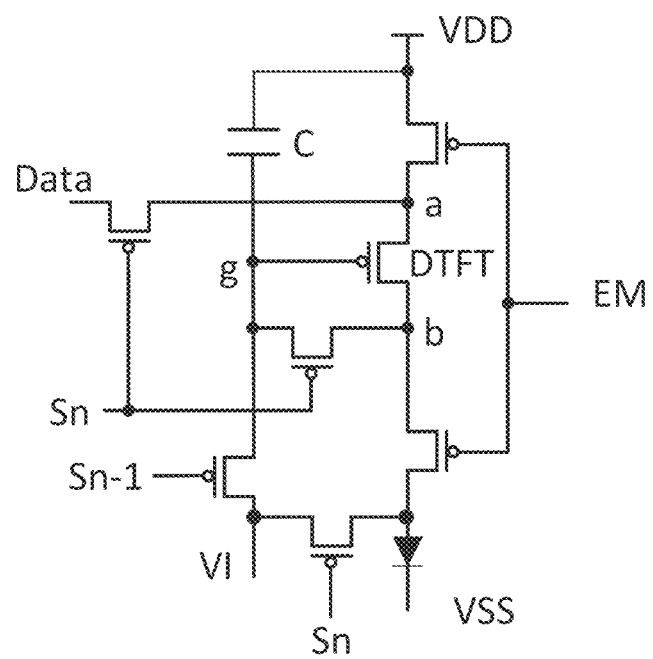
FIG. 4A is a circuit schematic diagram of a pixel 7T1C of the foldable OLED display panel of the present disclosure.

Refer to FIG. 4A, which is a circuit schematic diagram of a pixel 7T1C of the foldable OLED display panel of the present disclosure. A gate on array (GOA) circuit 7 is composed of seven thin-film transistors (TFT) and one capacitor. Multi-pulses and scanning signals in any shape are generated by a clock signal design.

Figure 4B:
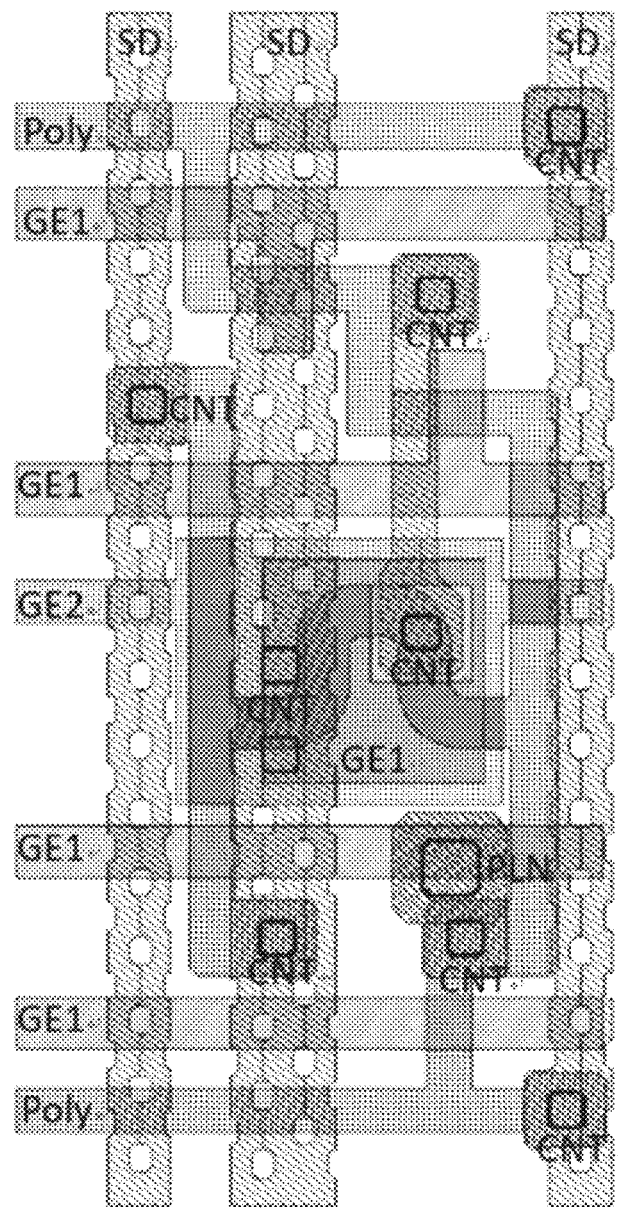
FIG. 4B is a circuit layout of the pixel 7T1C of the foldable OLED display panel of the present disclosure.

Refer to FIG. 4B, which is a circuit layout of the pixel 7T1C of the foldable OLED display panel of the present disclosure. Four first scanning signal lines (GE1) arranged along a horizontal direction correspond to a scanning circuit signal of N−1th stage (Sn−1), a scanning circuit signal of Nth stage (Sn), a TFT switching control circuit signal (EM) and a scanning circuit signal of N+1th stage (Sn+1) respectively in the circuit schematic diagram from up to down. These signal lines are provided by the GOA circuits; wires of active layers (Poly) marked in the horizontal direction are connected to source-drain metal layers (SD) via the through holes (CNT) and connected to VI signals; second scanning signal lines (GE2) marked in the horizontal direction are not only connected to one plate of the capacitor but also connected to power supply positive voltage (VDD) signals by boring holes in the source-drain metal layer (SD); three SD wires marked in a vertical direction are data signal lines (Data), power supply positive voltage (VDD) signal lines and voltage VI lines from left to right sequentially. These three signals are directly provided by a driver chip.

Specifically, in order to prevent signal lines located in the folded region of the pixel circuit from breaking, edges and interior of the signal lines (SD) disposed in the vertical direction are processed by boring holes. The purpose is to increase signal transmission lines after boring holes, reduce the stress generated on the signal lines during folding, further improve the bending resistance of the signal lines, and extend the service lifespan of a screen.

Figure 5:
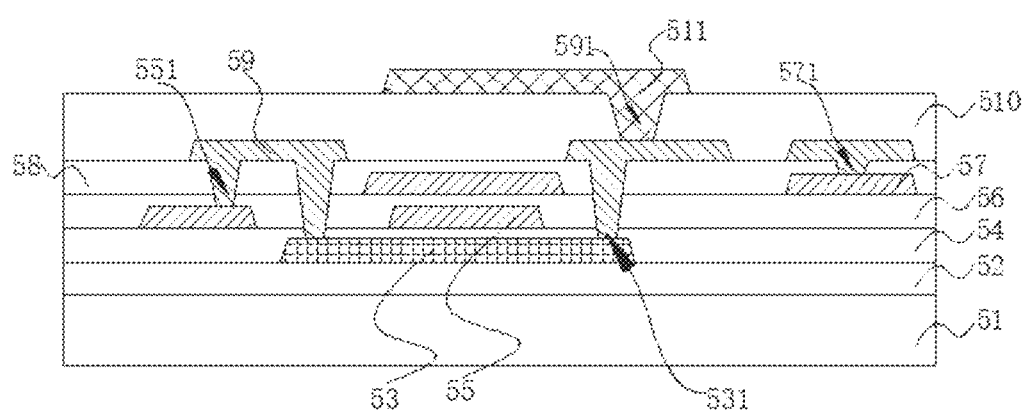
FIG. 5 is a schematic view of a structure of a pixel film layer in the folded region of the foldable OLED display panel of the present disclosure.

Refer to FIG. 5, which is a schematic view of a structure of a pixel film layer in the folded region of the foldable OLED display panel of the present disclosure. A buffer layer 52, an active layer 53, a first gate insulating layer 54, a first gate metal layer 55, a second gate insulating layer 56, a second gate metal layer 57, an interlayer insulating layer 58, a source-drain metal layer 59, a passivation layer 510 and an anode metal layer 511 are disposed from down to up on a flexible substrate 51 of the folded region, wherein first through holes 531 are disposed at two ends of an edge of the active layer 53, second through holes 551 are disposed on the first gate metal layer 55, third through holes 571 are disposed on the second gate metal layer 57, and fourth through holes 591 are disposed on the source-drain metal layer. 59

Specifically, the source-drain metal layer 59 is electrically connected to the active layer 53 via the first through holes 531, the source-drain metal layer 59 is electrically connected to the first gate metal layer 55 via the second through holes 551, the source-drain metal layer 59 is electrically connected to the second gate metal layer 57 via the third through holes 571, and the anode metal layer 511 is electrically connected to the source-drain metal layer 59 via the fourth through holes 591.

Specifically, a material of each of the first sub-signal lines is the same as a material of the source-drain metal layer lines 59.

Beneficial effects of the present disclosure are as below: a part of the signal lines in the folded region are configured to be the waveform lines or provided with through holes in the foldable OLED display panel provided in the present disclosure, so that a bending resistance of the signal lines in the folded region is improved, and a risk of poor display caused by cracks in the signal lines after multiple bending is further reduced.

In summary, although the present disclosure has been disclosed in the above preferred embodiments, the above preferred embodiments are not used to limit the present disclosure. A person skilled in the art can make various modifications and refinements without departing from the spirit and scope of the present disclosure, and the scope of protection of the present disclosure is defined by the claims.

What is claimed is:

1. A foldable organic light-emitting diode (OLED) display panel, comprising:
a display region having a folded region and a non-folded region, and further including a plurality of rows of pixel units, a plurality of signal lines, and gate on array (GOA) unit circuits of a plurality of stages,
wherein the GOA unit circuits of each stage are electrically connected to a corresponding row of the pixel units by the signal lines, and the GOA unit circuits of each stage are configured to drive the corresponding rows of the pixel units;
wherein the signal lines further comprise first sub-signal lines overlapping the folded region, and the first sub-signal lines are configured to be waveform lines, or surfaces of the first sub-signal lines are provided with through holes;
wherein the signal lines further comprise second sub-signal lines overlapping the non-folded region and the second sub-signal lines are straight lines.

2. The foldable OLED display panel as claimed in claim 1, wherein the through holes on the surfaces of the first sub-signal lines are disposed in a single row, and the through holes are arranged along bending paths of the first sub-signal lines.

3. The foldable OLED display panel as claimed in claim 1, wherein the through holes on the surfaces of the first sub-signal lines are disposed in a double row, and the through holes are arranged along bending paths of the first sub-signal lines.

4. The foldable OLED display panel as claimed in claim 2, wherein shapes of the through holes are round or oval.

5. The foldable OLED display panel as claimed in claim 3, wherein shapes of the through holes are round or oval.

6. The foldable OLED display panel as claimed in claim 1, wherein the signal lines comprise GOA signal lines, pixel unit signal lines and power signal lines.

7. The foldable OLED display panel as claimed in claim 1, wherein an input signal in the GOA unit circuits of a Nth stage is provided by an output signal of the GOA unit circuits of a N−1th stage, and a switching signal of the pixel unit of a Nth row and an input signal of the GOA unit circuits of a N+1th stage are provided by an output signal of the GOA unit circuits of the Nth stage.

8. The foldable OLED display panel as claimed in claim 1, wherein a buffer layer, an active layer, a first gate insulating layer, a first gate metal layer, a second gate insulating layer, a second gate metal layer, an interlayer insulating layer, a source-drain metal layer, a passivation layer and an anode metal layer are disposed from down to up on a flexible substrate of the folded region, wherein first through holes are disposed at two ends of an edge of the active layer, second through holes are disposed on the first gate metal layer, third through holes are disposed on the second gate metal layer, and fourth through holes are disposed on the source-drain metal layer.

9. The foldable OLED display panel as claimed in claim 8, wherein the source-drain metal layer is electrically connected to the active layer via the first through holes, the source-drain metal layer is electrically connected to the first gate metal layer via the second through holes, the source-drain metal layer is electrically connected to the second gate metal layer via the third through holes, and the anode metal layer is electrically connected to the source-drain metal layer via the fourth through holes.

10. The foldable OLED display panel as claimed in claim 8, wherein a material of each of the first sub-signal lines is same as a material of each of the source-drain metal layer lines.

11. A foldable OLED display panel, comprising: a display region having a folded region and a non-folded region, and further including a plurality of rows of pixel units, a plurality of signal lines, and gate on GOA unit circuits of a plurality of stages, wherein the GOA unit circuits of each stage are electrically connected to a corresponding row of the pixel units by the signal lines, and the GOA unit circuits of each stage are configured to drive the corresponding rows of the pixel units;
wherein the signal lines further comprise first sub-signal lines overlapping the folded region, and the first sub-signal lines are configured to be waveform lines, or surfaces of the first sub-signal lines are provided with through holes.

12. The foldable OLED display panel as claimed in claim 11, wherein the through holes on the surfaces of the first sub-signal lines are disposed in a single row, and the through holes are arranged along bending paths of the first sub-signal lines.

13. The foldable OLED display panel as claimed in claim 11, wherein the through holes on the surfaces of the first sub-signal lines are disposed in a double row, and the through holes are arranged along bending paths of the first sub-signal lines.

14. The foldable OLED display panel as claimed in claim 12, wherein shapes of the through holes are round or oval.

15. The foldable OLED display panel as claimed in claim 13, wherein shapes of the through holes are round or oval.

16. The foldable OLED display panel as claimed in claim 11, wherein the signal lines comprise GOA signal lines, pixel unit signal lines and power signal lines.

17. The foldable OLED display panel as claimed in claim 11, wherein an input signal in the GOA unit circuits of a Nth stage is provided by an output signal of the GOA unit circuits of a N−1th stage, and a switching signal of the pixel unit of a Nth row and an input signal of the GOA unit circuits of a N+1th stage are provided by an output signal of the GOA unit circuits of the Nth stage.

18. The foldable OLED display panel as claimed in claim 11, wherein a buffer layer, an active layer, a first gate insulating layer, a first gate metal layer, a second gate insulating layer, a second gate metal layer, an interlayer insulating layer, a source-drain metal layer, a passivation layer and an anode metal layer are disposed from down to up on a flexible substrate of the folded region, wherein first through holes are disposed at two ends of an edge of the active layer, second through holes are disposed on the first gate metal layer, third through holes are disposed on the second gate metal layer, and fourth through holes are disposed on the source-drain metal layer.

19. The foldable OLED display panel as claimed in claim 18, wherein the source-drain metal layer is electrically connected to the active layer via the first through holes, the source-drain metal layer is electrically connected to the first gate metal layer via the second through holes, the source-drain metal layer is electrically connected to the second gate metal layer via the third through holes, and the anode metal layer is electrically connected to the source-drain metal layer via the fourth through holes.

20. The foldable OLED display panel as claimed in claim 18, wherein a material of each of the first sub-signal lines is same as a material of each of the source-drain metal layer lines.

* * * * *